United States Patent [19]
Hikichi

[11] Patent Number: 5,254,960
[45] Date of Patent: Oct. 19, 1993

[54] OSCILLATOR CIRCUIT CAPABLE OF REMOVING NOISE

[75] Inventor: Hiroshi Hikichi, Tokyo, Japan

[73] Assignee: NEC Corporation, Tokyo, Japan

[21] Appl. No.: 928,752

[22] Filed: Aug. 13, 1992

[30] Foreign Application Priority Data

Aug. 26, 1991 [JP] Japan .................. 3-212540

[51] Int. Cl.[5] .................. H03B 1/04; H03B 5/32; H03K 5/01
[52] U.S. Cl. .................. 331/46; 331/74; 331/158; 307/268; 328/164; 328/165
[58] Field of Search .................. 331/46, 47, 74, 75, 331/158; 307/268; 328/164, 165

[56] References Cited

U.S. PATENT DOCUMENTS 4,546,394 10/1985 Yamamoto .................. 328/164 X
4,959,557 9/1990 Miller .................. 331/74 X Primary Examiner—Siegfried H. Grimm
Attorney, Agent, or Firm—Leydig, Voit & Mayer

[57] ABSTRACT

A low frequency oscillator circuit to be integrated in a microcomputer for a low consumption power operation with an improved noise resisting performance. The oscillator circuit includes a high frequency clock generator circuit, a shift register for shifting a low frequency signal by the clock, logical AND and OR circuits each receiving the low frequency signal and the output of the shift register, and a flip-flop circuit to be set and reset by the outputs of the logical AND and OR circuits.

5 Claims, 7 Drawing Sheets

OSCILLATOR CIRCUIT CAPABLE OF REMOVING NOISE

BACKGROUND OF THE INVENTION

The present invention relates to an oscillator circuit, and more particularly to an oscillator circuit integrated in a semiconductor integrated circuit (IC) such as a microcomputer or the like.

Description of the Related Arts

Recently, a single chip microcoputer (hereinafter referred to as "micom") integrated with peripherals such as a ROM (read only memory) for storing programs, a RAM (random access memory) for storing data, a timer counter, a serial interface and the like, requires both high speed operation and a low power operation of a timer. Usually both a high frequency oscillator circuit for obtaining a high frequency clock of at least several MHz for realizing the high speed operation and a low frequency clock of approximately several tens KHz for realizing the low power timer operation are integrated within the micom.

These requirements are quite important when, for example, an application requires a continuation of a timer count during battery backup operation after a power supply to the micom is stopped for some reason. Further, for operation with the battery backup, a low voltage of approximately 2 V is also required As a result, an operation in a wide power voltage range is also required.

At this time, usually, the operation of the oscillator circuit for obtaining the high frequency clock of several MHz is stopped for achieving the low power consumption.

In FIG. 1, there is shown a conventional low frequency oscillator circuit 1 for obtaining a clock of approximately several tens KHz. The low frequency oscillator circuit 1 comprises a feedback resistor R11, an inverter I11 connected in parallel with the feedback resistor R11, and a quartz resonator 11 connected in parallel with the former two parts via terminals T11 and T12.

Usually, the feedback resistor R11 has a high impedance of 5 to 10 MΩ, and the inverter I11 is designed so as to be small in its drive ability. Hence, the low frequency oscillator circuit 1 is constructed so as to perform an oscillation operation with a low power consumption.

In FIG. 2, (a) shows an oscillation waveform at the terminal T11 when there is no external electromagnetic noise, (b) shows an oscillation waveform at the terminal T11 when an external electromagnetic noise is mixed or overlapped with the oscillation waveform at a certain timing, and (c) shows an output signal of the inverter I11 when the external electromagnetic noise is mixed or overlapped with the oscillation waveform in the same manner as shown by (b) in FIG. 2. The external electromagnetic noise may be generated, for example, when the micom itself is operated at a high speed.

More specifically, in case of an oscillation frequency of 32 KHz, a beard form pulse having a width of approximately 3 μS is generated at the output of the inverter I11. In FIG. 2, (b) also shows that the voltage at the terminal T11 is raised at a moment by the noise and then the oscillation is continued again from that point. In this case, the restoration to the original oscillation operation is performed according to an exponential function curve of a time constant determined by a floating capacitance (not shown) of the feedback resistor R11 and the terminal T11.

For example, when the output signal of this oscillator circuit is used as a counting clock for a timer, by generating the beard form pulse of several μS in the output signal of the inverter I11 due to the external electromagnetic noise, the timer unusually runs too fast.

In the above-described conventional oscillator circuit, since the input impedance of the inverter is decided by the feedback resistor having the resistance of approximately 5 to 10 MΩ, it is quite liable to receive the influence of the external electromagnetic noise. Further, when the output signal of the inverter is used as the counting clock of the timer, by generating the beard form pulse of several μS due to the electromagnetic noise, the timer extraordinarily runs too fast.

SUMMARY OF THE INVENTION

It is therefore an object of the present invention to provide an oscillator circuit in view of the aforementioned defects of the prior art, which is capable of effectively removing a noise such as an external electromagnetic noise or the like, mixed with an output signal of the oscillator circuit and preventing the timer from running too fast when the output signal is used as a counting clock for the timer.

In accordance with one aspect of the present invention, there is provided an oscillator circuit, including an oscillator mechanism for outputting an oscillation signal of a first frequency. A first clock generator circuit generates a first clock signal of a second frequency higher than the first frequency. A shift register of a plurality of shift stages successively shifts the oscillation signal in synchronism with the first clock signal. A logical AND circuit calculates a logical AND of the oscillation signal and an output of the shift register. A logical OR circuit calculates a logical OR of the oscillation signal and the output of the shift register. A flip-flop circuit is set and reset by outputs of the logical AND circuit and the logical OR circuit.

The oscillator circuit can further include a first memory circuit for storing high and low level states by predetermined instructions and a first selector circuit for selecting either the output of the flip-flop circuit or the oscillation signal corresponding to a stored content of the first memory circuit.

The oscillator circuit can further include a detecting circuit means for detecting whether or not both the output of the flip-flop circuit and the oscillation signal are a predetermined level; a synchronizing circuit means for synchronizing an output of the first memory circuit by an output of the detecting circuit; and a second selector circuit means for selecting either the output of the flip-flop circuit or the oscillation signal corresponding to an output of the synchronizing circuit.

The oscillator circuit can further include a second clock generator circuit means for generating a second clock signal of a third frequency higher than the first frequency; a second memory circuit means for storing high and low level states by predetermined instructions; and a third selector circuit means for selecting either the first clock signal or the second clock signal corresponding to a stored content of the second memory circuit.

According to the present invention, an external electromagnetic noise mixed or overlapped with an output of a low frequency oscillator circuit can be effectively removed. Further, in case that the output of the low frequency oscillator circuit is used for a counting clock of a timer, when a beard form pulse having several μS due to the electromagnetic noise is mixed or overlapped, an extraordinary too fast running of the timer can be effectively prevented.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENTS

Figure 3:
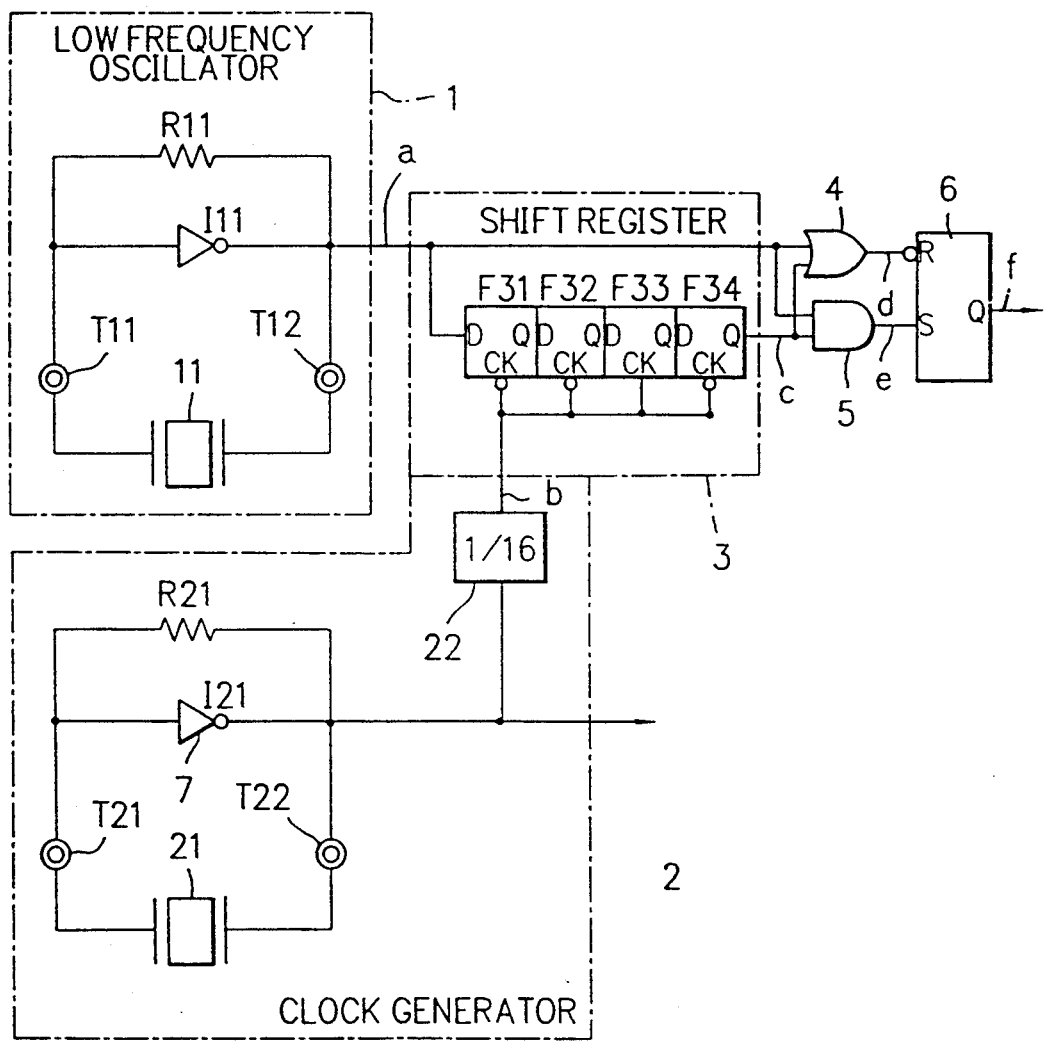
FIG. 3 is a block diagram of a first embodiment of an oscillator circuit according to the present invention.

Referring now to the drawings, wherein like reference characters designate like or corresponding parts throughout the views and thus the repeated description thereof can be omitted for brevity, there is shown in FIG. 3 the first embodiment of an oscillator circuit according to the present invention.

Figure 1:
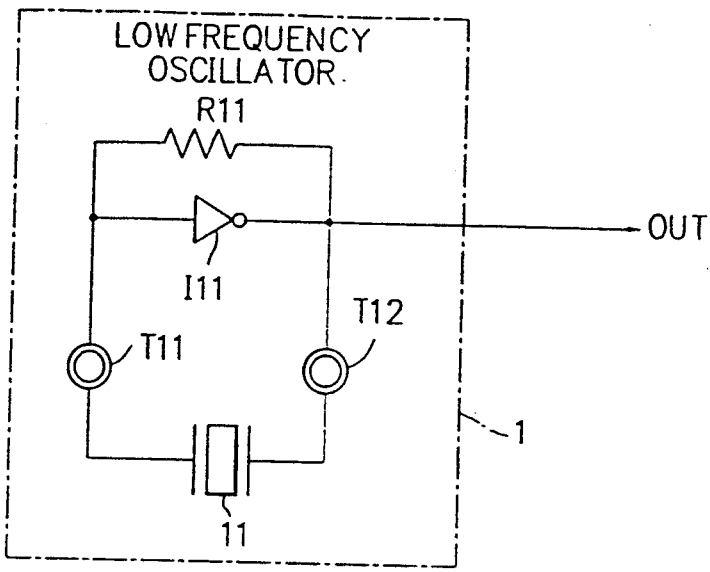
FIG. 1 is a block diagram of a conventional oscillator circuit.
Figure 2:
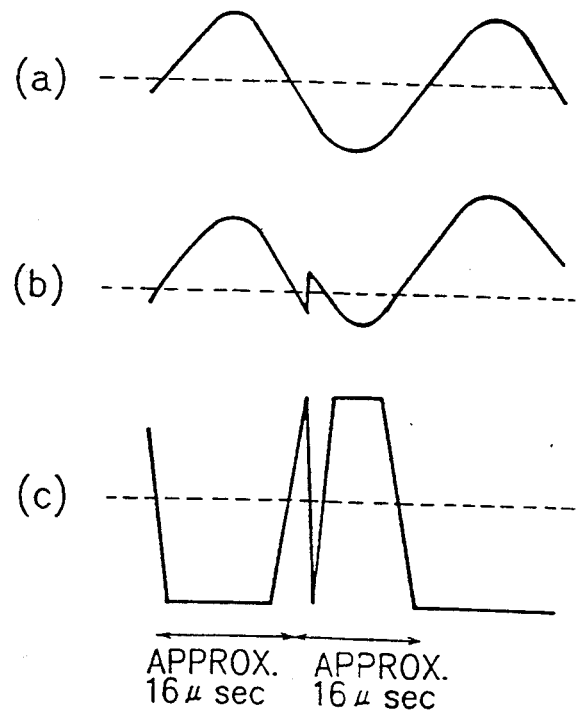
FIG. 2 is a timing chart exhibiting the operation of the oscillator circuit shown in FIG. 1.

As shown in FIG. 3, the oscillator circuit comprises a low frequency oscillator circuit 1 having the same construction as the conventional oscillator circuit shown in FIG. 1, a clock generator circuit 2 for generating a high frequency clock, a shift register 3 composed of four D flip-flops F31 to F34 constituting a shift stage, connected to the low frequency oscillator circuit 1, an OR circuit 4 for calculating a logical sum or OR of the output of the shift register 3 and the output of the low frequency oscillator circuit 1, and AND circuit 5 for calculating a logical product or AND of the output of the shift register 3 and the output of the low frequency oscillator circuit 1, and an RS flip-flop 6 which is set by the output of the AND circuit 5 and is reset by the output of OR circuit 4.

The low frequency oscillator circuit 1 includes a feedback resistor R11, an inverter I11 and a quartz resonator 11 which are connected in parallel with each other via terminals T11 and T12, as described above.

The clock generator circuit 2 includes a feedback resistor R21, an inverter I21 connected in parallel with the feedback resistor R21, and a quartz resonator 21 connected in parallel with the former two parts via terminals T21 and T22.

Usually, the feedback resistor R21 has a resistance of approximately 1 MΩ. An input impedance of the terminal T21 is not so high and thus the clock generator circuit 2 is hardly influenced by an external electromagnetic noise. The output of the inverter I21 is used as a clock for an instruction process operation or the like of the micom. In this case, the output of the inverter I21 is fed to a frequency divider 22, and the frequency divider 22 outputs a frequency-divided clock to clock terminals of the four D flip-flops F31 to F34 of the shift register 3.

Figure 4:
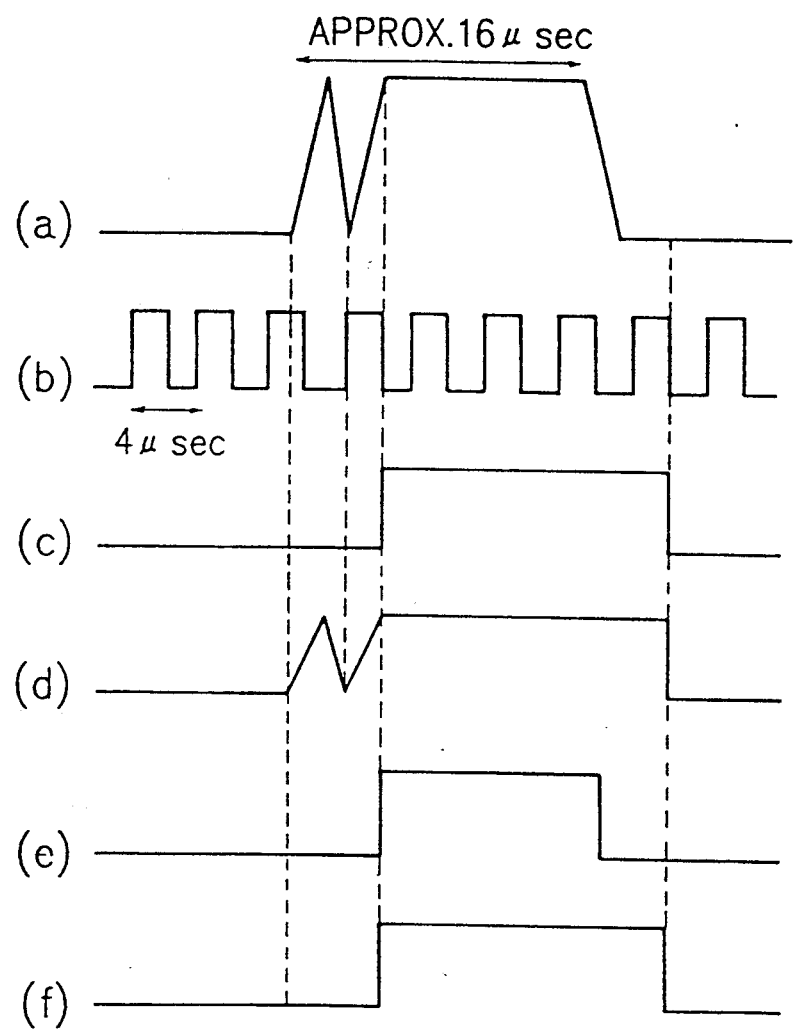
FIG. 4 is a timing chart exhibiting the operation of the oscillator circuit shown in FIG. 3.

Next, the operation of the above-described oscillator circuit will now be described in detail in connection with FIG. 4 showing signals (a), (b), (c), (d) and (e) appearing in FIG. 3.

Now, assuming that an oscillation frequency of the quartz resonator 21 is 4 MHz, the output frequency of the inverter I21 is 4 MHz. The frequency divider 22 divides the oscillation frequency 4 MHz into 1/16 to output a clock (b) having a frequency of 250 KHz. The clock (b) is fed from the frequency divider 22 to the clock terminals of the four D flip-flops F31 to F34 of the shift register 3. In the shift register 3, an output (a) of the inverter I11 of the low frequency oscillator circuit 1 is successively shifted from the flip-flop F31 to the flip-flop F34 every input of the clock (b). An output (c) of the flip-flop F34 or the shift register 3 and the output (a) of the inverter I11 of the low frequency oscillator circuit 1 are input to the OR circuit 4 and the AND circuit 5. Then, the OR circuit 4 and the AND circuit 5 calculate the logical OR and the logical AND, respectively. An output of the OR circuit 4 is inverted by an inverter (not shown), and an inverted output (d) is input to the RS flip-flop 6 in order to reset the RS flip-flop 6. An output (e) of the AND circuit 5 is fed to the RS flip-flop 6 in order to set the RS flip-flop 6 to obtain an output signal (f).

In this case, the output (c) of the shift register 3 is obtained by shifting the output (a) of the inverter I11 by four clocks (b). When both the output (a) of the inverter I11 and the output (c) of the shift register 3 are a low level, the inverted output (d) of the OR circuit 4 is the low level. When both the output (a) of the inverter I11 and the output (c) of the shift register 3 are a high level, the output (e) of the AND circuit 5 is the high level. Hence, when the output (e) of the AND circuit 5 is the high level, the RS flip-flop 6 is set, and, when inverted output (d) of the OR circuit 4 is the low level, the RS flip-flop 6 is reset to output the output signal (f).

Therefore, as shown in FIG. 4, even when an external electromagnetic noise is mixed or overlapped with the output (a) of the inverter I11 of the low frequency oscillator circuit 1 to generate a beard form pulse having several μS, the beard form pulse is not transferred to the output signal (f) of the RS flip-flop 6, and thus it is readily understood that the external electromagnetic noise can be removed.

In this embodiment, it is clear that the dividing ratio of the frequency divider 22 can be ⅛ in place of 1/16 and the number of the stages of the shift register can be increased to twice to obtain the same effects as described above. Further, it is apparent that instead of the clock generator circuit 2, the clock can be directly supplied from the outside with the same effects as described above.

Figure 5:
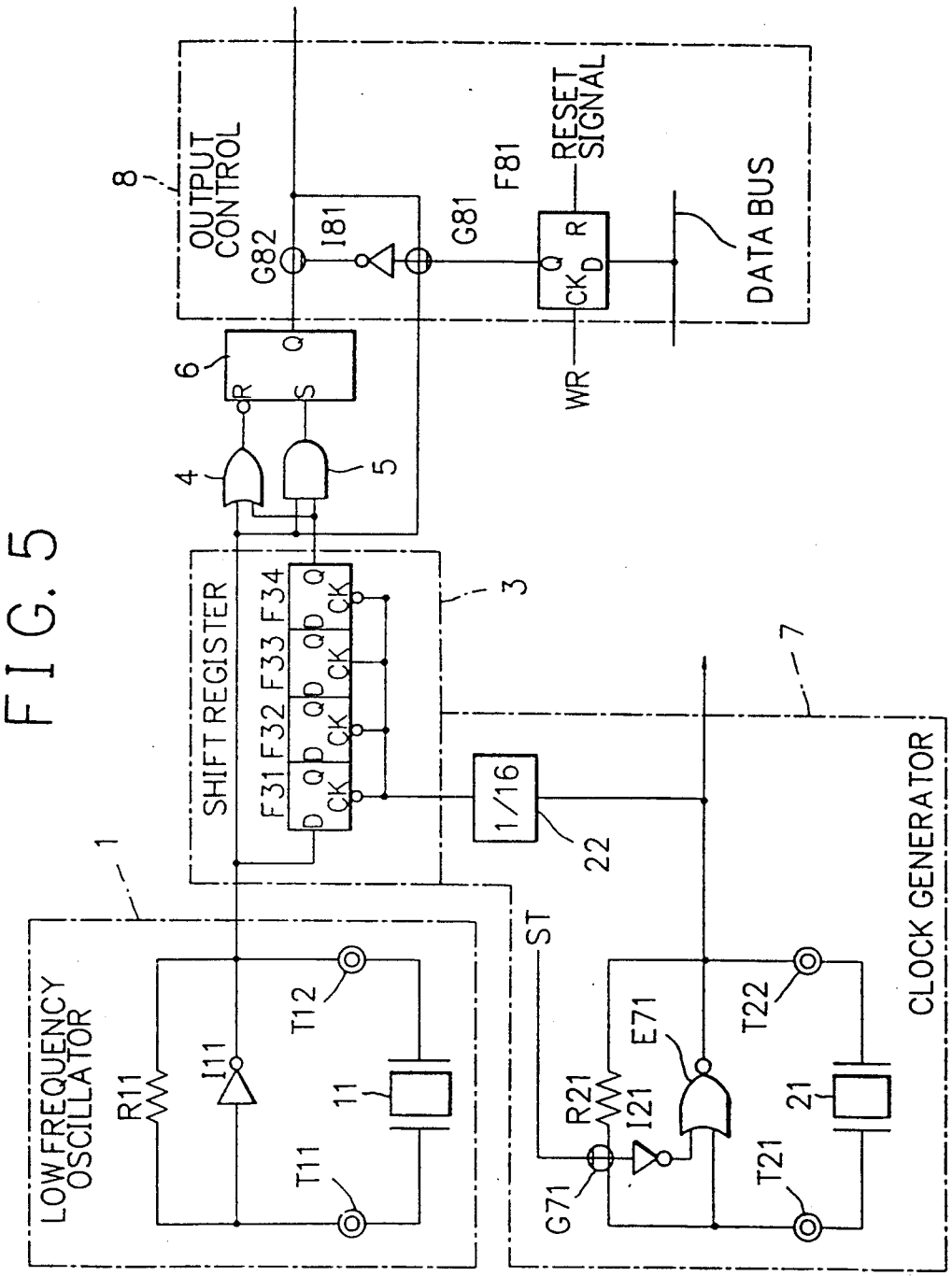
FIG. 5 is a block diagram of a second embodiment of an oscillator circuit according to the present invention.

In FIG. 5, there is shown the second embodiment of an oscillator circuit according to the present invention, having the same construction as the first embodiment shown in FIG. 3, except that a clock generator circuit 7 is provided in place of the clock generator circuit 2 and an output control circuit 8 is added on the output side of the RS flip-flop 6.

In this embodiment, the clock generator circuit 7 is formed by adding a transfer gate G71 and a NOR circuit E71 to the clock generator circuit 2 of the first embodiment. That is, the transfer gate G71 is controlled by a control signal ST for stopping the high frequency oscillation for the clock and is connected to the feedback resistor R21 in series. To the NOR circuit E71, the output of the inverter I21 and the signal at the terminal T21 are input to output a signal to the frequency divider 22.

The output control circuit 8 includes a D flip-flop F81 for latching certain data by a write control signal WR input via a data bus of the micom, a transfer gate G81 controlled by an output of the D flip-flop F81, an inverter I81 for inverting the output of the D flip-flop F81, and a transfer gate G82 controlled by an output of the inverter I81. In this case, the transfer gate G81 directly transfers the output of the low frequency oscillator circuit 1 when the output of the D flip-flop F81 is the high level, and the transfer gate G82 transfers the output of the RS flip-flop 6 when the output of the D flip-flop F81 is the low level. The D flip-flop F81 is initialized by a reset signal and supposedly outputs a low level signal when no writing is input from the data bus.

Next, the operation of the second embodiment of the oscillator circuit will now be described in detail in connection with FIG. 6.

Usually, the micom has a high frequency clock stop function for reducing the consumption power during the low consumption power operation, and at this oscillation stop time, the control signal ST is the low level. Accordingly, the transfer gate G71 becomes off, and the output of the inverter I21 is the high level. Hence, the output of the NOR circuit E71 is fixed to the low level, and the oscillation is stopped. Thus, no clock is supplied to the frequency divider 22 and the shift register 3, and the noise removal operation is stopped.

Figure 6:
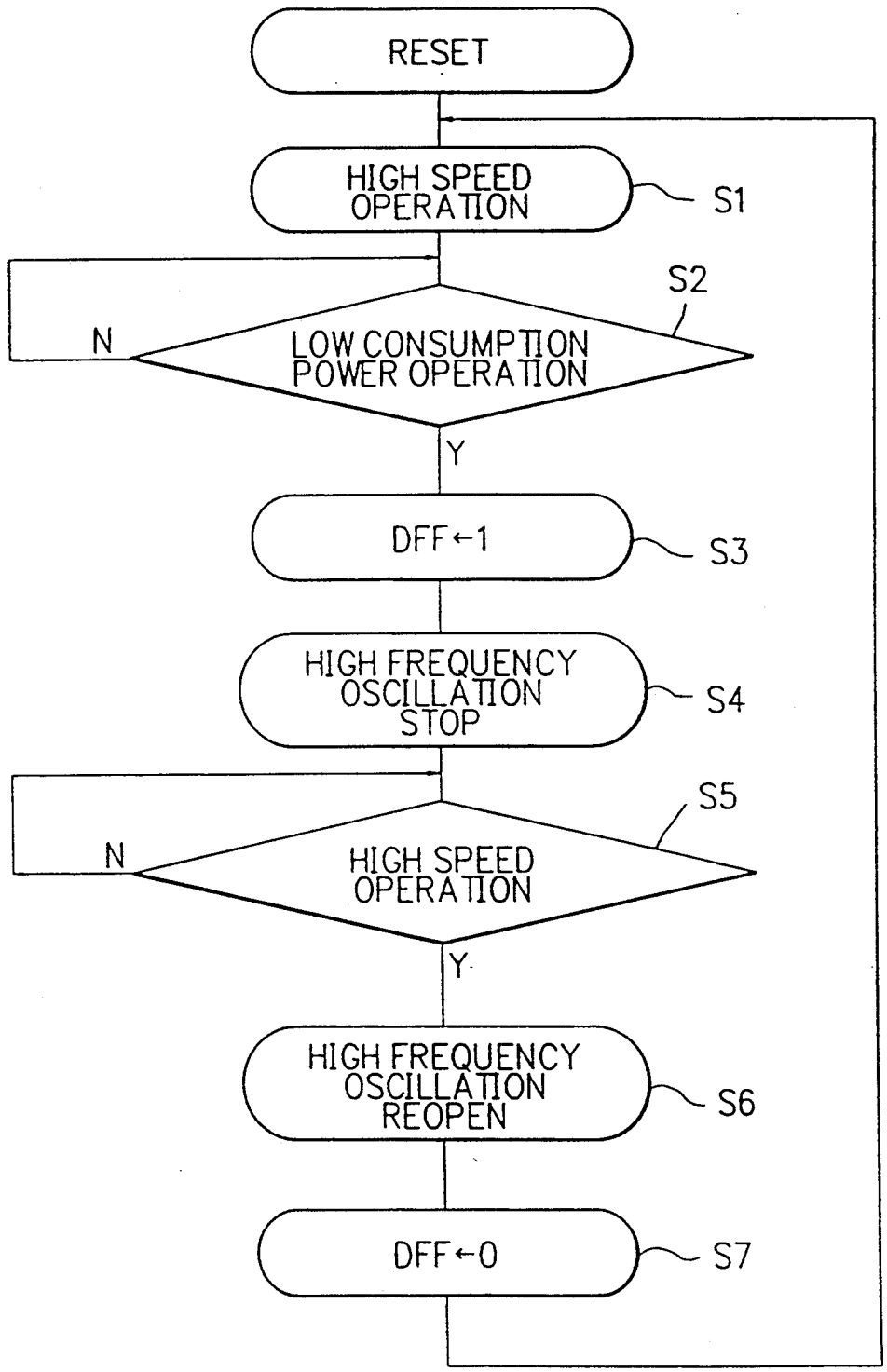
FIG. 6 is a flow chart illustrating the operation of the oscillator circuit shown in FIG. 5.

In order to compensate the disadvantage, the control is carried out in the process shown in FIG. 6 in the low consumption power operation.

First, when the high speed operation in step S1 is switched to the low consumption power operation in step S2, the high level is written in the D flip-flop F81 via the data bus to output the high level in step S3. Hence, the transfer gate G81 is turned on and the transfer gate G82 is turned off to directly transfer the low frequency signal. As a result, the timer operation and the like can be possible.

Then, the control signal ST is set to the low level to stop the high frequency clock in step S4. During the high frequency clock stop, the noise occurrence from the micom is less, and thus no influence can be given to the low frequency oscillation.

Next, when the high speed operation is performed again in step S5, first, the control signal ST is set to the high level to reopen the oscillation of the clock generator circuit 7 in step S6. Then, the low level is written in the D flip-flop F81 via the data bus to output the low level in step S7. Hence, the transfer gate G82 is turned on and the transfer gate G81 is turned off to remove the noise from the low frequency signal. Thus, the low frequency signal whose noise is removed is output.

In this embodiment, the writing to the D flip-flop F81 and the setting operation of the control signal ST to the low level can be performed by predetermined instructions of the micom.

Figure 7:
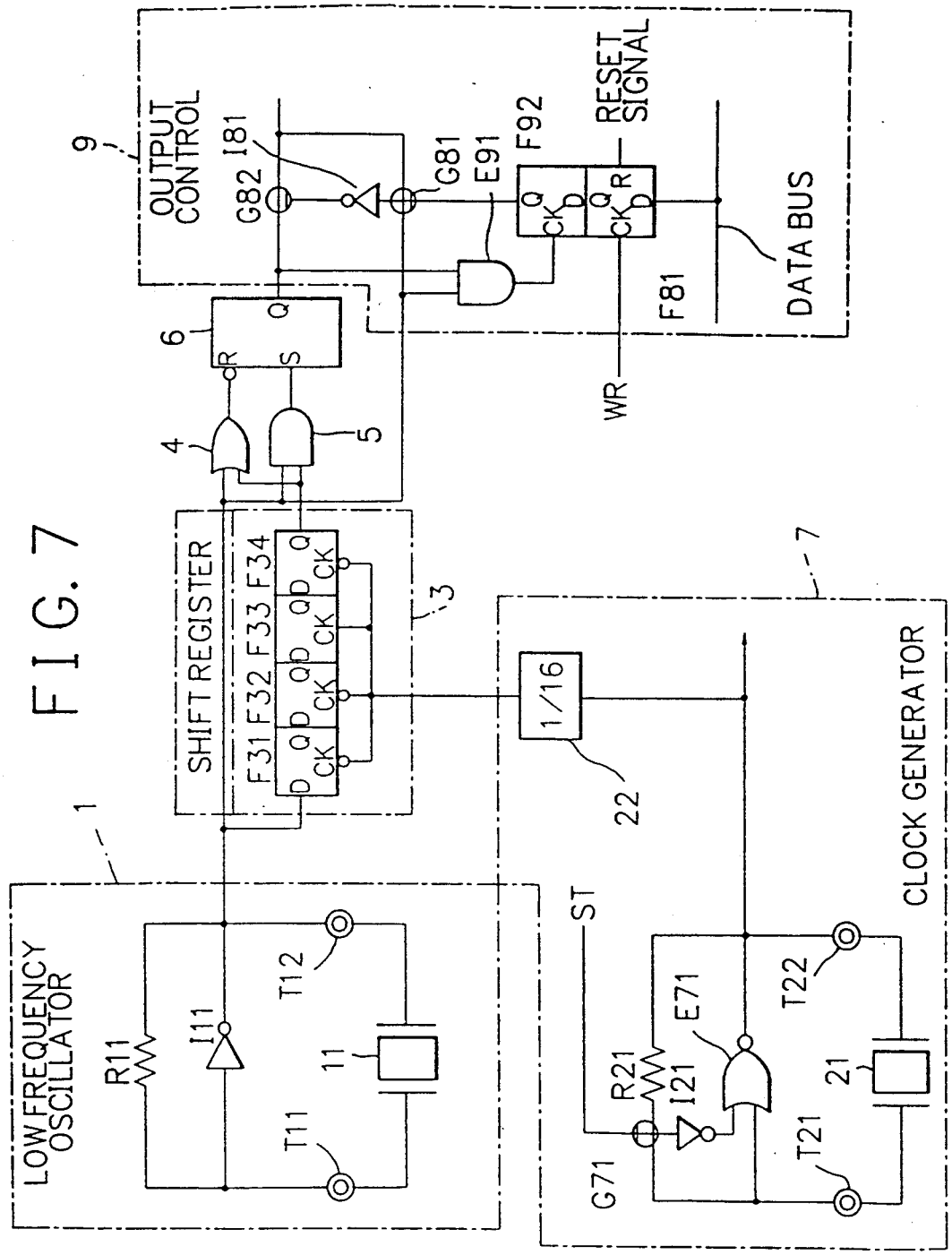
FIG. 7 is a block diagram of a third embodiment of an oscillator circuit according to the present invention.

In FIG. 7, there is shown the third embodiment of an oscillator circuit according to the present invention, having the same construction as the second embodiment shown in FIG. 5, except that an output control circuit 9 further including an AND circuit E91 and a D flip-flop F92 is provided in place of the output control circuit 8.

In this embodiment, to the AND circuit E91, the output of the inverter I11 or the low frequency oscillator circuit 1 and the output of the RS flip-flop 6 are input. An output of the AND circuit E91 as a clock and the output of the D flip-flop F81 are input to the D flip-flop F92, and the D flip-flop F92 drives the transfer gate G81 and the inverter I81.

Next, the operation of the third embodiment of the oscillator circuit will now be described in detail.

In the second embodiment shown in FIG. 5, for example, it is assumed that by outputting the high level from the D flip-flop F81 to turn on the transfer gate G81, the output of the low frequency oscillator circuit 1 is selected. Now, it is considered that the D flip-flop F81 is rewritten to the low level by the certain instruction of the micom right after the output of the inverter I81 is changed to the low level from the high level. Hence, the transfer gate G82 is turned on, and the output of the RS flip-flop 6 is selected. However, at a moment when the output of the inverter I81 is changed to the low level from the high level, the output of the RS flip-flop 6 is still kept to the high level, and a level change more than necessity occurs in the signal selected by the transfer gate G81 or G82. This fact is not so important so far as the rewriting number of the D flip-flop F81 is small. But, in case of the large rewriting number of the D flip-flop F81, when this signal is used for a counting clock of a timer of the like, the timer unusually runs too fast.

Accordingly, in this embodiment, by the AND circuit E91, it is detected whether or not both the output of the RS flip-flop 6 and the output of the inverter I11 or the low frequency oscillator circuit 1 are the same level (high level in this case). By this detection signal, the output of the D flip-flop F81 is memorized in the D flip-flop F92, and by its output, the transfer gates G81 and G82 are controlled. That is, in synchronism with the time when the output of the RS flip-flop 6 and the output of the inverter I11 are the same level, either output of these two is selected, and the change more than necessity of the selected signal is restricted.

Figure 8:
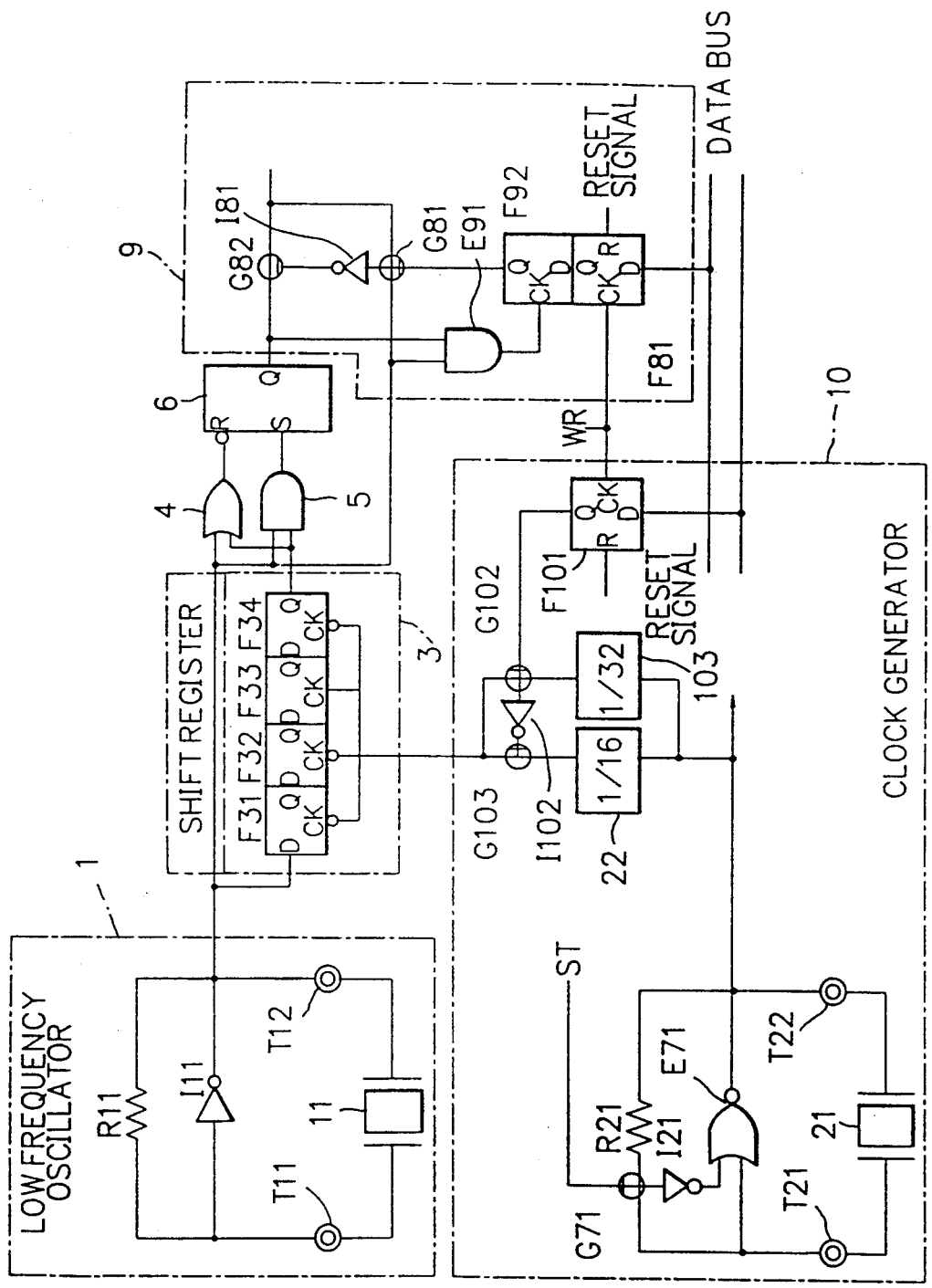
FIG. 8 is a block diagram of a fourth embodiment of an oscillator circuit according to the present invention.

In FIG. 8, there is shown the fourth embodiment of an oscillator circuit according to the present invention, having the same construction as the third embodiment shown in FIG. 7, except that a clock generator circuit 10 is provided in place of the clock generator circuit 7.

In this embodiment, the clock generator circuit 10 further includes a D flip-flop F101, a frequency divider 103 for dividing the output of the NOR circuit E71 into 1/32, two transfer gates G102 and G103 for selecting either a 1/32 divided clock or a 1/16 divided clock of the output of the NOR circuit E71 by an output of the D flip-flop F101, and an inverter I102.

Next, the operation of the fourth embodiment of the oscillator circuit will now be described in detail.

First, to the D flip-flop F101, similar to the D flip-flop F81, the high level or the low level is written by the predetermined instruction of the micom. Further, the D flip-flop F101 is initialized by the reset signal and outputs the low level at this time. Hence, the transfer gate G103 is turned on to supply the output of the 1/16 frequency divider 22 as the clock to the shift register 3.

Hence, for instance, even when the oscillation frequency of the quartz oscillator 21 is 8 MHz or twice of 4 MHz of the first to third embodiments described above, by writing the high level in the D flip-flop F101, the output of the 1/32 frequency divider 103, the same frequency of the first to third embodiments, as the clock can be supplied to the shift register 3. Thus, in this embodiment, the same noise removal time width as the first to third embodiments can be settled, and the flexibility can be extended.

As described above, according to the present invention, by providing the high frequency clock generator circuit means, the shift register means for shifting the low frequency signal by the clock, the logical AND circuit means for the low frequency signal and the output of the shift register, the logical OR circuit means for the low frequency signal and the output of the shift register, and the flip-flop circuit means set or reset by the output of the logical AND or the logical OR, the external electromagnetic noise mixed or overlapped with the output of the low frequency oscillator circuit can be effectively removed. Therefore, in case that the output of the low frequency oscillator circuit is used for the counting clock of the timer, when the beard form pulse having several μS due to the electromagnetic noise is mixed or overlapped, the extraordinary too fast running of the timer can be effectively prevented.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An oscillator circuit, comprising:
   an oscillator means for outputting an oscillation signal of a first frequency;
   a first clock generator circuit means for generating a first clock signal of a second frequency higher than the first frequency;
   a shift register means of a plurality of shift stages for successively shifting the oscillation signal in synchronism with the first clock signal;
   a logical AND circuit means for calculating a logical AND of the oscillation signal and an output of the shift register;
   a logical OR circuit means for calculating a logical OR of the oscillation signal and the output of the shift register; and
   a flip-flop circuit means to be set and reset by outputs of the logical AND circuit and the logical OR circuit.

2. The oscillator circuit as claimed in claim 1, further comprising:
   a first memory circuit means for storing high and low level states by predetermined instructions; and
   a first selector circuit means for selecting either the output of the flip-flop circuit or the oscillation signal corresponding to a stored content of the first memory circuit.

3. The oscillator circuit as claimed in claim 1, further comprising:
   a first memory circuit;
   a detecting circuit means for detecting whether or not both the output of the flip-flop circuit and the oscillation signal are a predetermined level;
   a synchronizing circuit means for synchronizing an output of the first memory circuit by an output of the detecting circuit; and
   a second selector circuit means for selecting either the output of the flip-flop circuit or the oscillation signal corresponding to an output of the synchronizing circuit.

4. The oscillator circuit as claimed in claim 3, further comprising:
   a second clock generator circuit means for generating a second clock signal of a third frequency higher than the first frequency;
   a second memory circuit means for storing high and low level states by predetermined instructions; and
   a third selector circuit means being connected to the shift register;
   said third selector circuit means selecting either the first clock signal or the second clock signal corresponding to a stored content of the second memory circuit.

5. The oscillator circuit as claimed in claim 3, further comprising:
   a fourth selector circuit means for selecting a shift stage number of the shift register corresponding to the stored content of the second memory circuit.

* * * * *